(12) United States Patent
Koh et al.

(10) Patent No.: US 10,658,256 B2
(45) Date of Patent: May 19, 2020

(54) SEMICONDUCTOR MOLD COMPOUND TRANSFER SYSTEM AND ASSOCIATED METHODS

(71) Applicant: Micron Technology, Inc., Boise, ID (US)

(72) Inventors: Kean Tat Koh, Singapore (SG); Lien Wah Choong, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/257,585

(22) Filed: Jan. 25, 2019

(65) Prior Publication Data

US 2019/0157172 A1    May 23, 2019

Related U.S. Application Data

(63) Continuation of application No. 15/670,351, filed on Aug. 7, 2017, now Pat. No. 10,199,299.

(51) Int. Cl.
*H01L 23/29* (2006.01)
*H01L 23/31* (2006.01)
(Continued)

(52) U.S. Cl.
CPC .............. *H01L 23/29* (2013.01); *B29C 33/28* (2013.01); *B29C 33/305* (2013.01); *B29C 33/42* (2013.01); *B29C 43/003* (2013.01); *B29C 43/18* (2013.01); *H01L 21/56* (2013.01); *H01L 21/565* (2013.01); *H01L 21/568* (2013.01); *H01L 23/31* (2013.01);
(Continued)

(58) Field of Classification Search
CPC ..... H01L 21/56; H01L 21/565; H01L 21/568; H01L 23/29; H01L 23/31; H01L 23/3107; B29C 33/28; B29C 33/305; B29C 33/42
See application file for complete search history.

(56) References Cited

U.S. PATENT DOCUMENTS

| 2010/0078833 A1* | 4/2010 | Nakazato | H01L 21/561 |
| | | | 257/787 |
| 2013/0216782 A1* | 8/2013 | Yamashita | B29C 37/0032 |
| | | | 428/141 |
| 2015/0017372 A1 | 1/2015 | Uragami et al. | |

FOREIGN PATENT DOCUMENTS

| CN | 101714533 A | 5/2010 |
| JP | 2012166432 A | 9/2012 |

(Continued)

OTHER PUBLICATIONS

International Application No. PCT/US2018/042525—International Search Report and Written Opinion, dated Nov. 7, 2018, 11 pages.

(Continued)

*Primary Examiner* — Joseph M Galvin, III
(74) *Attorney, Agent, or Firm* — Perkins Coie LLP

(57) ABSTRACT

Mold compound transfer systems and methods for making mold compound transfer systems are disclosed herein. A method configured in accordance with a particular embodiment includes providing a sheet mold compound, and dispensing a granular mold compound directly on the sheet mold compound. The sheet mold compound can have a first density and the overall granular mold compound can have a second density less than the first density. The method further comprises transferring the solid sheet carrying the dispensed granular mold compound to a molding machine without using a release film.

18 Claims, 5 Drawing Sheets

(51) Int. Cl.
  *B29C 33/28*   (2006.01)
  *B29C 33/30*   (2006.01)
  *B29C 33/42*   (2006.01)
  *H01L 21/56*   (2006.01)
  *B29C 43/18*   (2006.01)
  *B29C 43/00*   (2006.01)

(52) U.S. Cl.
  CPC .... *B29C 2043/181* (2013.01); *H01L 23/3107* (2013.01)

(56) References Cited

FOREIGN PATENT DOCUMENTS

| | | | |
|---|---|---|---|
| JP | 2014207302 | A | 10/2014 |
| JP | 2015233039 | A | 12/2015 |
| JP | 2017113941 | A | 6/2017 |
| KR | 20130124416 | A | 11/2013 |

OTHER PUBLICATIONS

TW Patent Application No. 107126645—Taiwanese Office Action and Search Report, dated May 3, 2019, 8 pages.

* cited by examiner

SEMICONDUCTOR MOLD COMPOUND TRANSFER SYSTEM AND ASSOCIATED METHODS

CROSS-REFERENCE TO RELATED APPLICATIONS

This application is a continuation of U.S. application Ser. No. 15/670,351, filed Aug. 7, 2017, which is incorporated herein by reference in its entirety.

TECHNICAL FIELD

The present technology relates to systems and methods for transferring mold compounds and molding semiconductor device structures. In particular, some embodiments of the present technology are related to compression molding of semiconductor device structures and packages.

BACKGROUND

Packaged semiconductor devices, such as memory chips and microprocessor chips, typically include a semiconductor device mounted to a substrate and encased in a protective covering. The device includes functional features, such as memory cells, processor circuits, and interconnecting circuitry. The protective covering conventionally includes a mold compound that is deposited over the semiconductor device packages and encapsulated in a compression molding machine. As shown in FIG. 1, a conventional mold transfer system 10 includes a granular mold compound 12 deposited onto a release film 14 and stacked within a containment area of a tray cover 16. The stacked granular mold compound 12 includes entrapped air 18 in interstitial spaces between individual grains of the granular mold compound 12. The deposited granular mold compound 12 extends above the release film 14 by a thickness (T). The conventional mold transfer system 10, including the release film 14, tray cover 16 and granular mold material 12, is transferred to a molding machine and placed over a semiconductor wafer having a plurality of semiconductor device packages. The tray cover 16 is then removed from the molding machine, and the release film 14 and granular mold material 12 remain to undergo compression molding. The granular mold material 12 is melted via compression molding to form an encapsulant over the semiconductor device packages. After the granular mold material 12 is molded on the semiconductor wafer, the release film 14 is removed.

One drawback with the conventional systems and methods described above is that the entrapped air between individual grains of the stacked granular mold material 12 can lead to voids when the granular mold material 12 is reflowed. As such, there is a general need to decrease the amount of entrapped air within an encapsulant material before being molded. Another drawback the conventional systems and methods is that the release films cannot withstand high elongation for thick semiconductor package molding and thus cannot produce molded thicknesses larger than 1.5 mm. Additionally, global competition continues to force semiconductor manufacturers to decrease costs, improve manufacturing efficiency, and improve the conventional systems and methods described above.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Specific details of several embodiments of methods for forming molded semiconductor device packages in a molding machine are described herein along with related methods, devices, and systems. The term "semiconductor device" generally refers to a solid-state device that includes semiconductor material. Examples of semiconductor devices include logic devices, memory devices, and diodes among others. Furthermore, the term "semiconductor device" can refer to a finished device or to an assembly or other structure at various stages of processing before becoming a finished device. Depending upon the context in which it is used, the term "substrate" can refer to a wafer-level substrate, a strip-level substrate, or a singulated, die-level substrate. A person skilled in the relevant art will recognize that suitable steps of the methods described herein can be performed at the wafer level, the strip level, or the die level. Furthermore, unless the context indicates otherwise, structures disclosed herein can be formed using conventional semiconductor-manufacturing techniques.

The term "semiconductor device package" can refer to an assembly of semiconductor devices that are stacked or otherwise incorporated into a common package. The semiconductor package can include a housing that partially or completely encapsulates the assembly of semiconductor devices. The term "semiconductor device assembly" can refer to an assembly of semiconductor devices. This term can also refer to an assembly of semiconductor devices and a support substrate that is coupled to the assembly of semiconductor devices. Support substrates include printed circuit boards (PCBs) or other suitable substrates that carry the assembly of semiconductor devices and provide electrical connections to the semiconductor device assembly. The term "molding machine" can refer to an apparatus using thermal and/or compression forces to mold an encapsulant at least partially around (e.g., over) one or more semiconductor device packages. The molding machine, for example, can include any machine having an upper chase and a lower chase and that compress and/or reflow a mold compound into a desired shape. A person skilled in the relevant art will also understand that the technology may have additional embodiments and that the technology may be practiced without several of the details of the embodiments described below with reference to FIGS. 2A-4C.

Figure 2A:
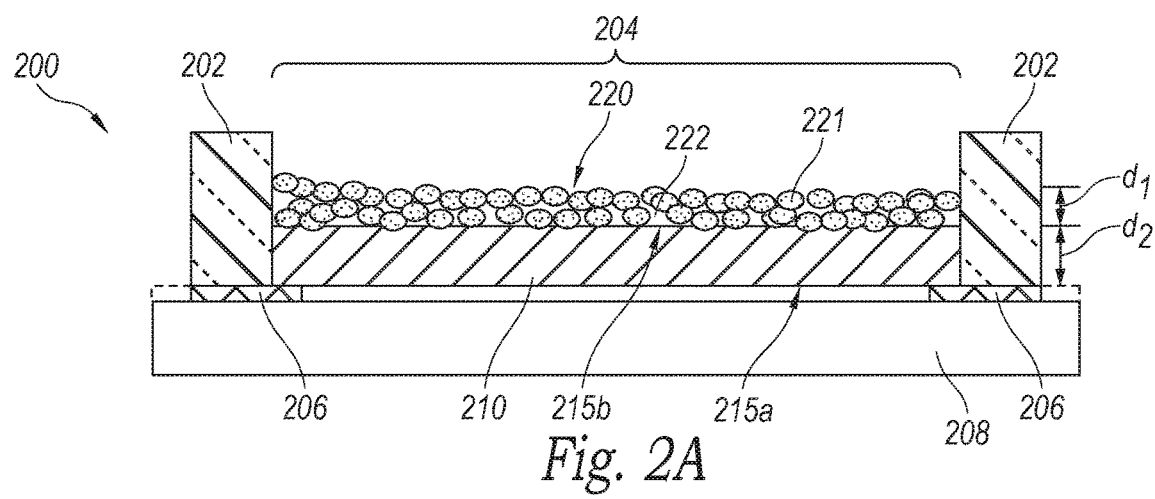
FIG. 2A is a cross-sectional side view of a mold compound transfer system configured in accordance with selected embodiments of the present technology.
Figure 2B:
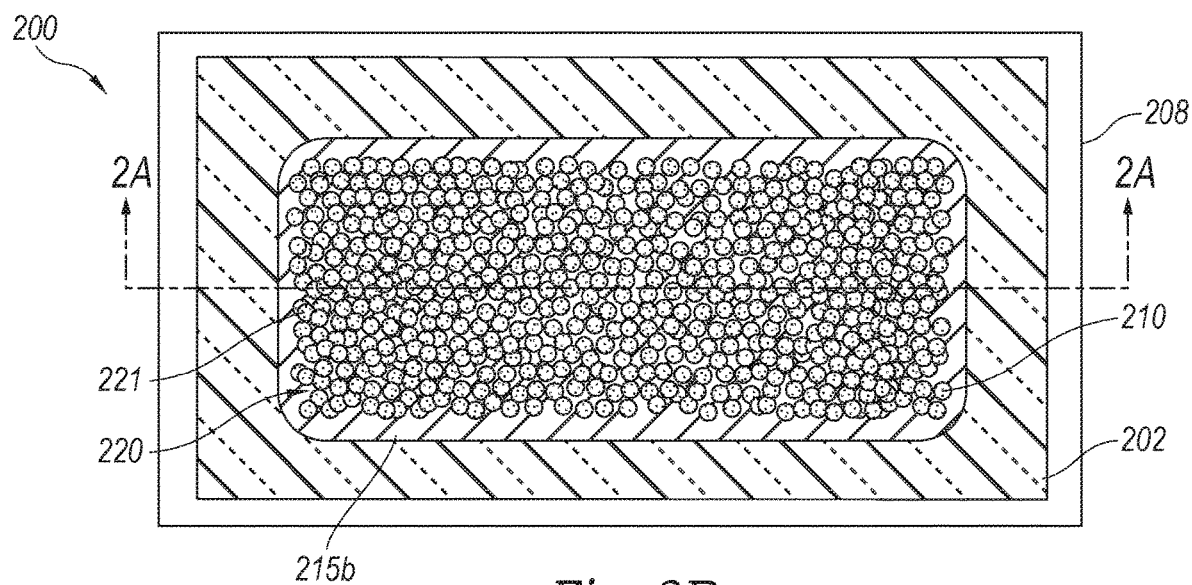
FIG. 2B is a top-plan view of the mold compound transfer system shown in FIG. 2A.

FIGS. 2A and 2B illustrate a mold compound transfer system 200 configured in accordance with selected embodiments of the present technology. Referring to FIGS. 2A and 2B together, the transfer system 200 includes a tray cover 202 and a support plate 206 positioned over a support structure (e.g., a table, mold chase, etc.) 208. The tray cover 202 defines an interior containment area 204. The support plates 206 can be in a closed position (as shown in FIG. 2B) to support material within the containment area 204 or an open position (shown schematically in dashed lines) to allow material to pass through the containment area 204.

In operation, a sheet of first mold compound 210 is positioned in the containment area 204 and at least partially overlaps the support plate 206 when the support plate 206 is in the closed position. The sheet mold compound 210 has a first side 215a facing toward the support plate 206 and a second side 215b facing away from the support plate 206. In the embodiment shown in FIGS. 2A and 2B, the sheet mold compound 210 spans substantially across the entire width of the containment area 204. After the sheet of mold compound 210 is in place, grains 221 of a second mold compound 220 are deposited over the second side 215b of the sheet mold compound 210. The grains 221 conform to the shape of the tray cover 202 as they are deposited to form a stack of the granular mold compound 220. The granular mold compound 220 includes entrapped air 222 in interstitial spaces between the individual grains 221. The sheet mold compound 210 supports and carries the stacked granular mold compound 220. The stacked granular mold compound 220 includes a first thickness, $d_1$, and the sheet mold compound 210 includes a second thickness, $d_2$, equal to or greater than the first thickness $d_1$. A combined thickness, $d_1$ and $d_2$, of the sheet and granular mold compounds 210, 220 is generally greater than about 3 millimeters (mm). In some embodiments, the combined thickness, $d_1$ and $d_2$, is between about 3 mm and about 10 mm, or about 3 mm and about 8 mm, or about 5 mm and about 7 mm. Accordingly, the sheet and granular mold compounds 210, 220 can be used to produce a molded wafer or strip greater than about 3 mm.

The sheet mold compound 210 can be composed of a flowable resin material or other encapsulant material generally known in the art. The sheet mold compound 210 can be a pre-pressed solid sheet that is self-supporting and formed to fit within the containment area 204 of the tray cover 206. In some embodiments, the sheet mold compound can include a fiberglass material used to laser mark individual sheet mold compounds with identifying marks. In some embodiments, the sheet mold compound 210 resembles the structure and function of the sheet mold compound manufactured by Shin-Etsu Chemical Co., Ltd. in Japan. As such, the sheet mold compound 210 can have a set weight, length and thickness, and be universally usable as an encapsulant material for different wafers and/or semiconductor device packages. The granular mold compound 220 can comprise any of the materials as the sheet mold compound 210. As such, the sheet and granular mold compounds 210, 220 can be formed from the same material or from different materials.

The sheet mold compound 210 generally does not include entrapped air, or at least includes less entrapped air than that present in the granular mold compound 220. As such, the density of the sheet mold compound 210 is greater than the density of the granular mold compound 220. Further, because the thickness, $d_2$, of the sheet mold compound 210 is greater than or equal to the thickness, $d_1$, of the granular mold compound 220, the weight of the sheet mold compound 210 is typically greater than the weight of the granular mold compound 220. The ratio of the weight of the sheet mold compound 210 to the weight of the granular mold compound 220 can be selected based on multiple factors.

For example, the granular mold compound 220 includes entrapped air 222 and thus the amount of granular mold compound 220 should be generally limited to avoid voids from occurring. However, as explained in more detail below with respect to FIG. 3, a sufficient amount of granular material is needed to accommodate the number of dies and die stacks for a particular wafer or strip. Additionally, the ratio by weight of the sheet mold compound 210 to the granular mold compound 220 needs to be high enough to ensure the sheet mold compound 210 has sufficient strength to support the granular mold compound 220. In some embodiments, a ratio of the weight of the sheet mold compound 210 to a weight of the granular mold compound 220 is from about 3:1 to about 5:1. In other embodiments, the ratio by weight of the sheet mold compound 210 to the granular mold compound 220 is about 4:1.

In accordance with various embodiments of the present technology, the mold compound transfer system 200 does not include or require a release film. Unlike conventional systems and methods in which a release film is needed to transfer the granular mold compound to the molding machine, the sheet mold compound 210 acts as a carrier for the granular mold compound 220. Accordingly, the release film can be removed from the process, decreasing costs (e.g., the costs of the release film) and the number of manufacturing process steps (e.g., the step of removing the release film) for the semiconductor manufacturer.

Another feature of the present technology is the decreased amount of entrapped air in the sheet and granular mold compounds 210, 220 compared to an equal thickness of only a granular mold compound. As previously mentioned, entrapped air 222 is present in the porous space between individual grains 221 and can lead to mold void when the granular mold compound 220 is melted to form an encapsulant. The present technology mitigates this issue because a majority of the mold compound used to form the encapsulant is supplied from the pre-pressed sheet mold compound 210 that does not include entrapped air. The remaining amount of mold compound supplied from the granular mold compound 220 is significantly less than the amount of granular mold compound used in the conventional system and methods.

Figure 1:
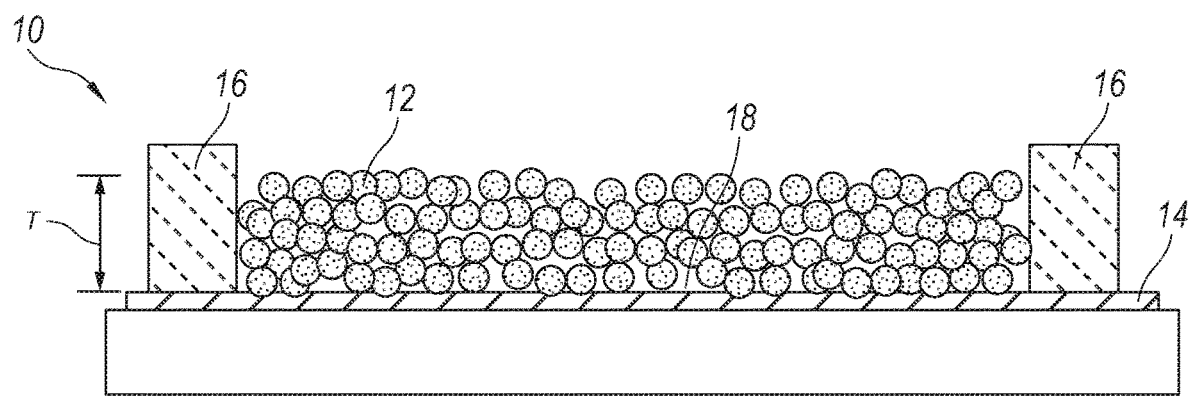
FIG. 1 is a cross-sectional side view of a conventional mold compound transfer system in accordance with the prior art.

Yet another feature of the present technology is the decreased thickness of the sheet and granular mold compounds 210, 220. The granular mold compound used by itself in conventional systems and methods has a lower density than the sheet mold compound 210. As such, the combined thicknesses, $d_1$ and $d_2$, of the sheet and granular mold compounds 210, 220 is less than the thickness of the granular mold compound by itself (e.g., "T" in FIG. 1). The decreased combined thicknesses, $d_1$ and $d_2$, allows for faster and more uniform heating of the sheet and granular mold compounds 210, 220. The decreased thickness also prevents premature gelation of the sheet and granular mold compounds 210, 220 during compression, which thereby can reduce wire sweeping for the wire bonded semiconductor device 406a-b.

A person skilled in the relevant art will recognize that this combination of the mold compound transfer system 200 including the sheet mold compound 210 and the granular mold compound 220 can be incorporated into a variety of other systems. Accordingly, the mold compound transfer system 200 can include features and configurations in addition to or in lieu of those illustrated in FIG. 2. For example, the containment area 204 may be formed by a structure other than the tray cover 202. Similarly, the ratios and thicknesses of the sheet and granular mold compounds 210, 220 can vary to accommodate individual wafers or strips and semiconductor device packages.

Figure 3:
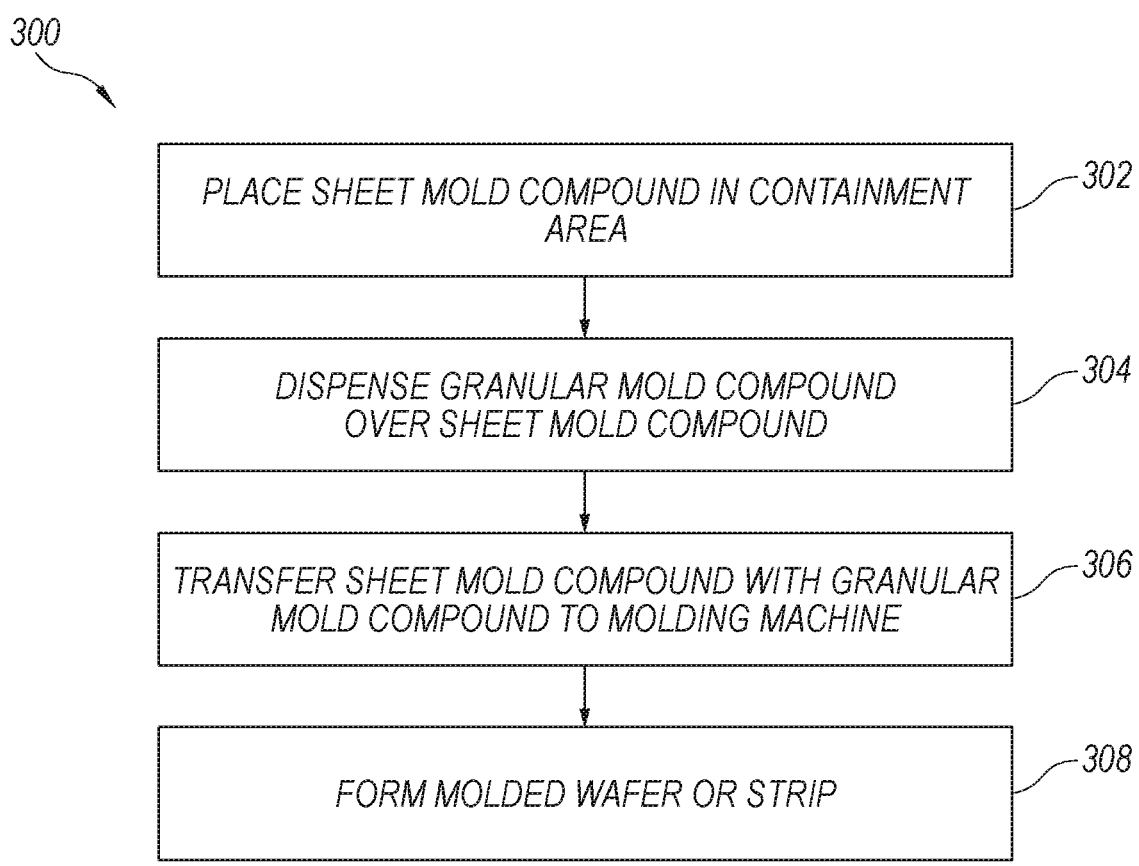
FIG. 3 is a flow diagram of a method for transferring mold compounds to a molding machine in accordance with selected embodiments of the present technology.

FIG. 3 is a flow chart of a method 300 for transferring mold compounds to a molding machine in accordance with selected embodiments of the present technology. The method 300 can include placing the sheet compound 210 within the containment area 204 of the tray cover 202 (process portion 302). Once the sheet compound 210 is placed within the containment area 204, the granular mold compound 220 is dispensed over the sheet mold compound 210 (process portion 304). As previously mentioned with respect to FIGS. 2A and 2B, the sheet mold compound 210 can be pre-pressed and have a set thickness and weight (i.e., a set amount of material). For example, a "pre-pressed" sheet mold compound 210 can be a preformed sheet that is made before it is positioned in the containment area 204. As such, the amount (i.e., the volume) of sheet mold compound 210 is known, and the amount of granular mold compound 220 is the only mold compound that is variable when determining the total amount of mold compound needed for a particular wafer or strip. The amount of granular mold compound 220 needed is equal to the difference between the total amount of mold compound needed and the amount supplied by the sheet mold compound 210. The total amount of granular mold compound 220 needed (and thus the amount of granular mold compound 220 needed) can vary depending on, for example, die thickness, the desired mold thickness, and the number of dies and/or die stacks for the semiconductor device packages on each wafer or strip. As such, for a given wafer or strip of the same mold thickness, a semiconductor device package with multiple dies will require less granular mold compound than a semiconductor device package with a single die of the same thickness because there is less interstitial space between the multiple dies that needs to be filled in with mold compound. For example, if a given strip has 100 dies attached thereto and during the die-attach process, five dies on the strip become unattached, then more granular mold compound needs to be added to compensate for the volume of the five unattached dies and ensure the desired mold thickness of the strip is met.

The method 300 continues by transferring the sheet mold compound 210 carrying the granular mold compound 220 to the molding machine (process portion 306). In some embodiments, transferring the sheet and granular mold compounds 210, 220 to the molding machine includes moving the entire mold compound transfer system 200, including the tray cover 202 and support plates 206, to the molding machine. The mold compound transfer system 200 including the sheet and granular mold compounds 210, 220 is placed into a mold cavity 452. Once the mold compound transfer system 200 is placed in the molding machine, the support plates 206 are moved to an open position and the tray cover 202 and the support plate 206 is removed, leaving only the sheet and granular mold compounds 210, 220 on the molding machine. The sheet and granular mold compounds 210, 220 are then exposed to heat and/or compression, and melted to form a molded wafer or strip (process portion 308).

Figure 4A:
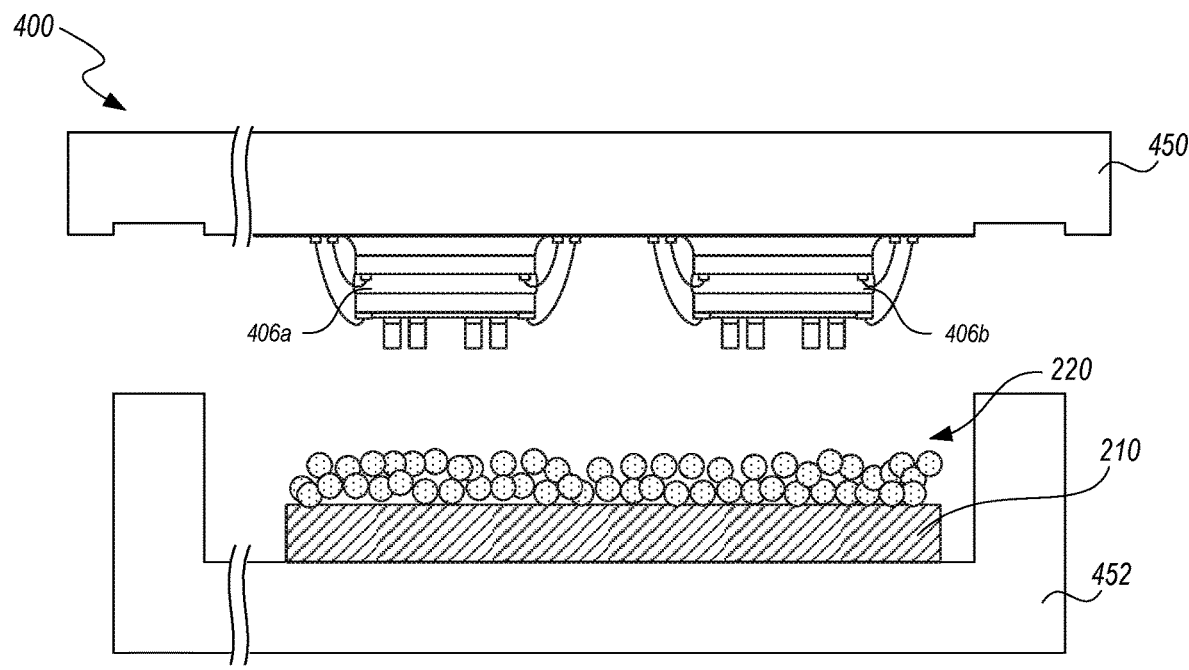
FIGS. 4A-4D are cross-sectional side views illustrating a semiconductor device at selected steps of a method for molding a semiconductor device in accordance with selected embodiments of the present technology.
Figure 4B:
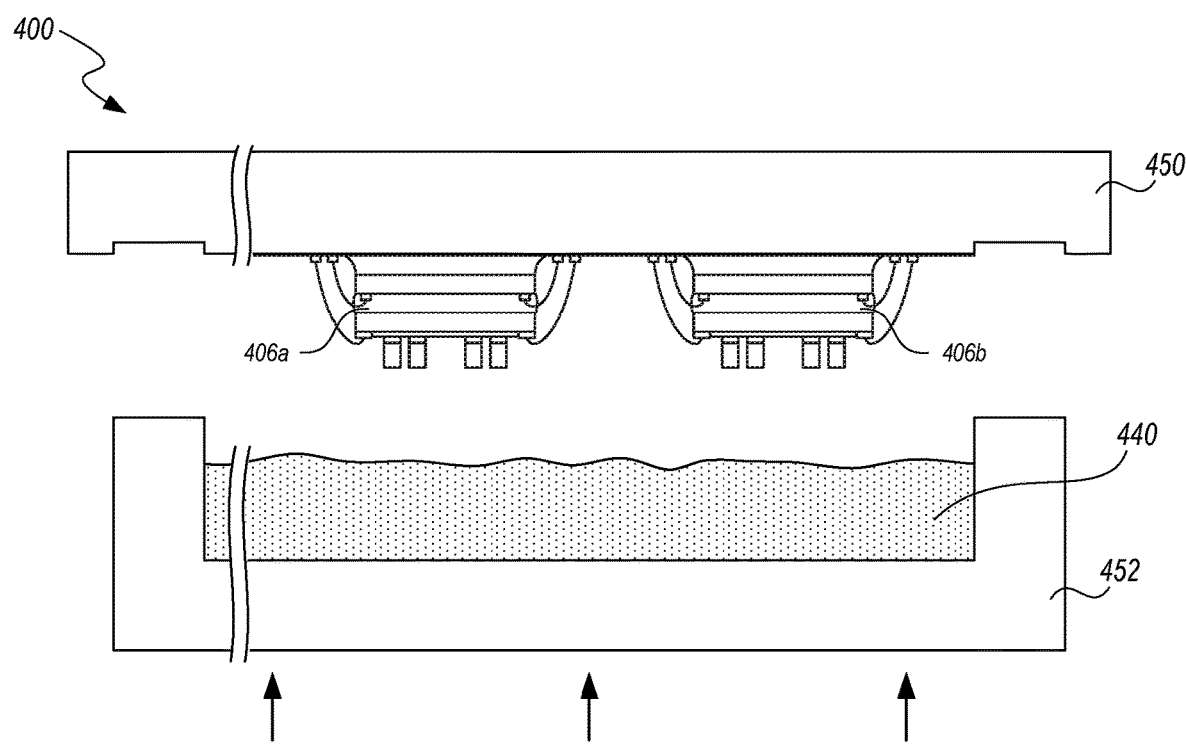
Figure 4C:
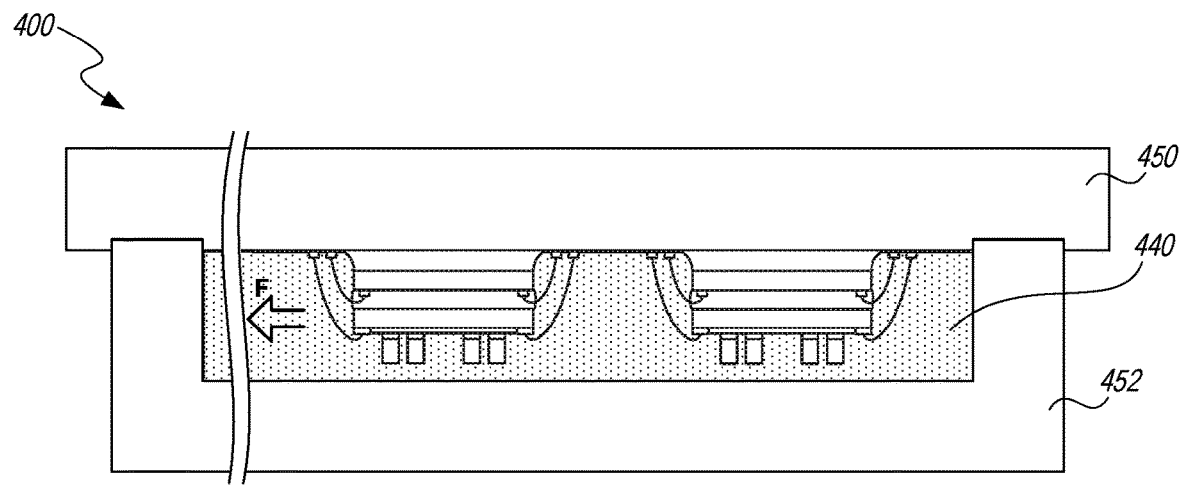
Figure 4D:
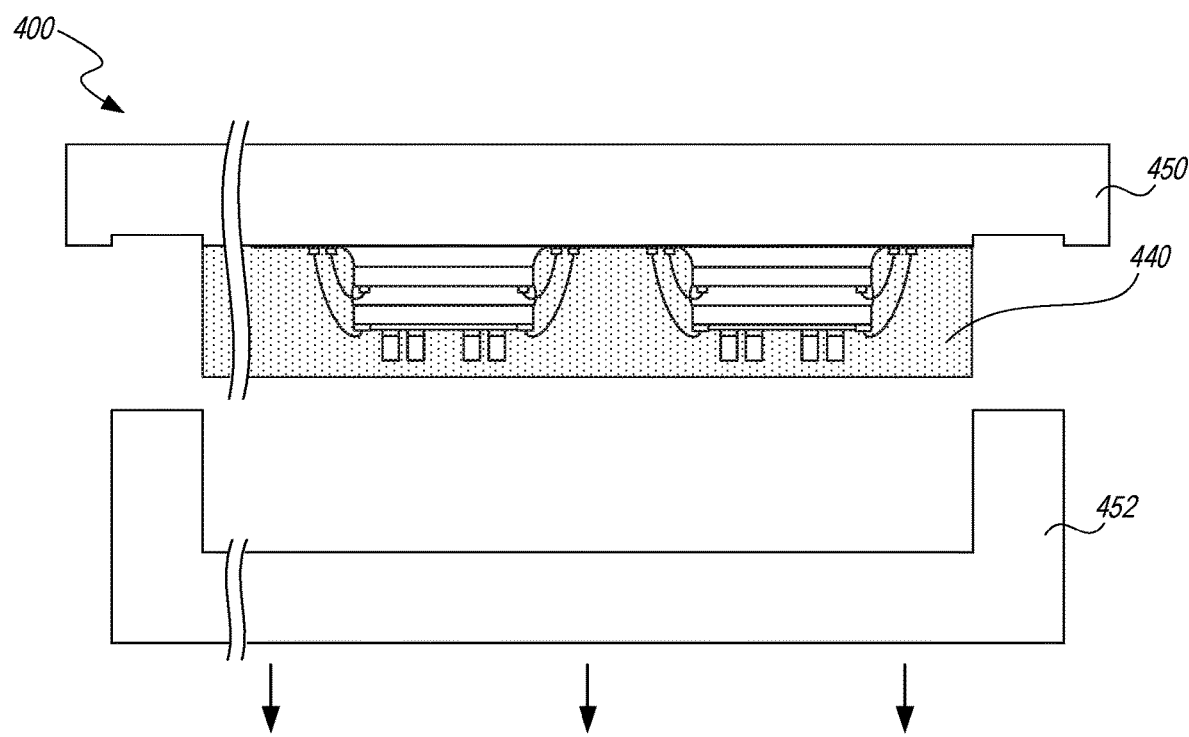

FIGS. 4A-4D illustrate the sheet and granular mold compounds 210, 220 placed within a molding machine 400. The molding machine 400 includes an upper chase 450 and a lower cavity 452 that are moved toward one another to form an encapsulant over semiconductor dies 406a-b. As shown in FIG. 4A, a strip including the semiconductor dies 406a-b is held to the upper chase 450 by a vacuum, and the sheet and granular mold compounds 210, 220 are placed within the lower cavity 452. As the upper chase 450 and lower cavity 452 move toward one another, the granular mold compound 220 melts to form a hybrid mold compound. The melted granular mold compound 220 is formed over the sheet mold compound 210, which can maintain its self-supporting structure at least until after the granular mold compound 220 has been melted. The sheet mold compound 210 then melts to form a uniform encapsulant material 440. As illustrated in FIG. 4C, the upper chase 450 and lower cavity 452 move further toward one another until a molding position is reached. As the upper chase 450 and lower cavity 452 move further toward one another, the encapsulant 440 flows towards the outer ends of the molding machine, as indicated by arrows F, and fills in interstitial spaces between the individual semiconductor dies 406a-b to at least partially encapsulate the strip. As illustrated in FIG. 4C, the upper chase 450 and lower cavity 452 are held in place for a certain time (e.g., 90-120 seconds) to allow the uniform encapsulation material 440 to mold (i.e., harden). As illustrated in FIG. 4D, the upper chase 450 and lower cavity 452 are moved away from another after the uniform encapsulation material 440 is molded.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. Reference herein to "one embodiment," "an embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

We claim:

1. A mold compound transfer system, comprising:
a sheet mold compound; and
a granular mold compound comprising a plurality of individual grains directly on the sheet mold compound and spanning across at least a portion of the sheet mold compound;
wherein:
a combined thickness of the sheet mold compound and the granular mold compound is greater than or equal to 3 millimeters.

2. The system of claim 1 wherein a ratio by weight of the sheet mold compound to the granular mold compound is between about 3:1 and about 5:1.

3. The system of claim 1, further comprising a tray cover defining an interior area, wherein the sheet mold compound spans across a majority of the interior area.

4. The system of claim 1 wherein the sheet mold compound and the individual grains have the same chemical composition.

5. The system of claim 1 wherein the sheet mold compound and the individual grains each include a resin material.

6. The system of claim 1 wherein the transfer system lacks a release film.

7. A mold compound transfer system comprising:
a sheet mold compound; and
a granular mold compound comprising a plurality of individual grains directly on the sheet mold compound and spanning across at least a portion of the sheet mold compound;
wherein:
the sheet mold compound has a first thickness and the granular mold compound has a second thickness less than the first thickness.

8. A method of transferring a mold compound without using a release film, the method comprising:
providing a solid sheet comprising a first mold material;
dispensing grains directly on the solid sheet such that the solid sheet carries the solid grains, wherein the grains comprise a second mold material; and
transferring the solid sheet carrying the dispensed grains to a molding machine;
wherein:
a combined thickness of the solid sheet and the dispensed grains is greater than or equal to 3 millimeters.

9. The method of claim 8 wherein transferring includes transferring the solid sheet carrying the dispensed grains without using a release film.

10. The method of claim 8 wherein the first mold material and the second mold material each include a flowable resin.

11. The method of claim 8 wherein the first mold material and the second mold material have the same chemical composition.

12. The method of claim 8 wherein a weight of the sheet mold compound is approximately three to five times greater than a weight of the granular mold compound.

13. The method of claim 8 wherein the solid sheet has a first thickness and the dispensed grains have a second thickness less than or equal to the first thickness.

14. A method of transferring a mold compound without using a release film, the method comprising:
providing a solid sheet comprising a first mold material;
dispensing grains directly on the solid sheet such that the solid sheet carries the solid grains, wherein the grains comprise a second mold material;
transferring the solid sheet carrying the dispensed grains to a molding machine; and
reflowing the solid sheet and dispensed grains to form a uniform mold material over the wafer.

15. A method of forming a molded semiconductor wafer, the method comprising:
providing a solid sheet of first mold compound;
placing grains of second mold compound directly on the solid sheet such that the grains are carried by the solid sheet; and
processing the grains of the second mold compound in a molding machine to form a hybrid mold compound including the solid sheet of first mold compound and a pressed layer of the second mold compound;
wherein:
based at least in part on a first weight of the first mold compound, determining a second weight of the second mold compound to be placed over the first mold compound.

16. The method of claim 15 wherein the hybrid mold compound defines an encapsulant over one or more dies.

17. The method of claim 15, further comprising before processing the solid grains, transferring the solid sheet to the molding machine without using a release film.

18. The method of claim 15 wherein the solid sheet of first mold compound has a first density and the solid grains of second mold compound has a second density less than the first density.

* * * * *